(12) United States Patent
Lee et al.

(10) Patent No.: US 9,324,417 B1
(45) Date of Patent: Apr. 26, 2016

(54) SYSTEMS AND METHODS FOR AVOIDING READ DISTURBANCE IN A STATIC RANDOM-ACCESS MEMORY (SRAM)

(71) Applicant: MARVELL INTERNATIONAL LTD., Hamilton (BM)

(72) Inventors: Winston Lee, Palo Alto, CA (US); Peter Lee, Pleasanton, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/586,096

(22) Filed: Dec. 30, 2014

Related U.S. Application Data (60) Provisional application No. 61/923,340, filed on Jan. 3, 2014.

(51) Int. Cl.
  *G11C 11/40* (2006.01)
  *G11C 11/419* (2006.01)
  *G11C 11/41* (2006.01)

(52) U.S. Cl.
  CPC .............. *G11C 11/419* (2013.01); *G11C 11/41* (2013.01)

(58) Field of Classification Search
  CPC ........ G11C 11/40; G11C 11/41; G11C 11/419
  USPC .................................... 365/154, 63, 156, 190
  See application file for complete search history.

(56) References Cited

U.S. PATENT DOCUMENTS

| | | | | |
|---|---|---|---|---|
| 3,575,617 A | * | 4/1971 | Burns | H03K 3/356104 327/210 |
| 4,175,290 A | * | 11/1979 | Harari | G11C 14/00 257/E27.098 |
| 6,469,930 B1 | * | 10/2002 | Murray | G11C 14/00 365/154 |
| 7,656,702 B2 | * | 2/2010 | Wijeratne | G11C 11/412 365/154 |
| 7,672,152 B1 | * | 3/2010 | Kulkarni | G11C 11/412 365/154 |

* cited by examiner

*Primary Examiner* — Tan T. Nguyen (57) ABSTRACT

Systems and methods are provided for reading from a static random-access memory (SRAM). The systems and methods include activating a first bitline connected to a first transistor, wherein the first transistor provides access to a state stored by the SRAM. The systems and methods further include preventing a second bitline from being activated when the first bitline is activated, wherein the second bitline is connected to a second transistor that isolates the SRAM from a reference potential when the second bitline is activated, and reading the state stored by the SRAM by triggering a wordline connected to a gate of the first transistor.

20 Claims, 6 Drawing Sheets

SYSTEMS AND METHODS FOR AVOIDING READ DISTURBANCE IN A STATIC RANDOM-ACCESS MEMORY (SRAM)

CROSS REFERENCE TO RELATED APPLICATION

This disclosure claims the benefit under 35 U.S.C. §119(e) of U.S. Provisional Application No. 61/923,340, filed on Jan. 3, 2014, which is incorporated herein by reference in its entirety.

FIELD OF USE

The present disclosure relates generally to systems and methods for improving the performance and reliability of static random-access memories (SRAMs). More particularly, the disclosure discusses techniques for avoiding read disturbance in an SRAM by providing separate bitlines for read and write access, respectively.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

Static random-access memory cells generally consist of two inverters that are coupled to one another through a feedback loop that is stable in only two states and remains in one of these two states as long as the SRAM cell remains connected to a high and low reference potential. In some implementations, the fact that SRAM cells retain a stored state without needing to be refreshed may be an advantage over other types of memory cells, such as dynamic random-access memory (DRAM) cells.

Although SRAM cells retain an information state without requiring to be refreshed, corruption of the stored information state may occur when an SRAM cell is being access for reading or writing. During writing, access transistors that connect the SRAM cell to bitlines may need to be strong enough to "flip" the state of the SRAM cell. In some aspects, this may require the access transistors to be stronger than the transistors that make up the SRAM cells. Although such a design requirement may be incorporated into some implementations, variations of transistor strength during fabrication may render some SRAM cells unusable (e.g., those SRAM cells where the access transistors are too weak due to process variations). Moreover, temperature fluctuations or other spurious effects may prevent SRAM cells in which access transistors are relatively weak from operating reliably.

During read operations, SRAM cells may suffer from read disturbance, for example, when reading takes sufficiently long, such that leakage of the transistors that make up the SRAM cell is large enough to flip the state of the SRAM cell. In this case, the information state stored by and about to be read from the SRAM cell may be compromised, leading to a read error.

In light of the above challenges, there is a need to improve the reliability of reading from and writing to SRAM cells.

SUMMARY OF THE DISCLOSURE

In accordance with an embodiment of the present disclosure, a method is provided for reading from a static random-access memory (SRAM). The method includes activating a first bitline connected to a first transistor, wherein the first transistor provides access to a state stored by the SRAM. The method further includes preventing a second bitline from being activated when the first bitline is activated, wherein the second bitline is connected to a second transistor that isolates the SRAM from a reference potential when the second bitline is activated, and reading the state stored by the SRAM by triggering a wordline connected to a gate of the first transistor.

In some implementations, the first bitline may be a read bitline and the second bitline may be a write bitline.

In some implementations, the wordline is a first wordline and the method further includes preventing a second wordline from being triggered when the first wordline is triggered, wherein the second wordline is connected to a gate of a third transistor that is activated when writing to the SRAM.

In some implementations, the wordline is a first wordline, and the method further includes modifying the state stored by the SRAM by activating the second bitline connected to a second transistor to isolate the SRAM from a reference potential, preventing the first bitline from being activated when the second bitline is activated, and modifying the state stored by the SRAM by triggering a second wordline connected to a gate of a second transistor.

In some implementations, activating the first bitline includes activating a third bitline connected to a third transistor, wherein the third transistor provides access to an inverse of the state stored by the SRAM.

In some implementations, preventing a second bitline from being activated when the first bitline is activated includes preventing a third bitline from being activated, wherein the third bitline is connected to a third transistor that isolates the SRAM from a reference potential when the third bitline is activated.

In accordance with an embodiment of the present disclosure, a system is provided that includes a static random-access memory (SRAM) connected to a first transistor and a second transistor. The system further includes control circuitry configured to activate a first bitline connected to a first transistor, wherein the first transistor provides access to a state stored by the SRAM. The control circuitry may further be configured to prevent a second bitline from being activated when the first bitline is activated, wherein the second bitline is connected to the second transistor that isolates the SRAM from a reference potential when the second bitline is activated. The control circuitry may further be configured to read the state stored by the SRAM by triggering a wordline connected to a gate of the first transistor.

In some implementations, the first bitline is a read bitline and the second bitline is a write bitline.

In some implementations, the wordline is a first wordline, and the control circuitry is further configured to prevent a second wordline from being triggered when the first wordline is triggered, wherein the second wordline is connected to a gate of a third transistor that is activated when writing to the SRAM.

In some implementations, the wordline is a first wordline, and the control circuitry is further configured to modify the state stored by the SRAM by activating the second bitline connected to the second transistor to isolate the SRAM from a reference potential, preventing the first bitline from being activated when the second bitline is activated, and modifying the state stored by the SRAM by triggering a second wordline connected to a gate of the second transistor.

In some implementations, the control circuitry is further configured to activate the first bitline by activating a third bitline connected to a third transistor, wherein the third transistor provides access to an inverse of the state stored by the SRAM.

In some implementations, the control circuitry may be further configured to prevent the second bitline from being activated by preventing a third bitline from being activated, wherein the third bitline is connected to a third transistor that isolates the SRAM from a reference potential when the third bitline is activated.

In accordance with an embodiment of the present disclosure, a static random access memory (SRAM) is provided. The SRAM may include a first transistor and a second transistor. The SRAM may further include an isolation transistor, wherein the isolation transistor, the first transistor, and the second transistor are connected in series between a first reference potential and a second reference potential. A gate of the first transistor and a gate of the second transistor may further be connected to a first node. The SRAM may further include a first access transistor that selectively couples a first bitline to the first node, wherein the first bitline is connected to a gate of the isolation transistor, and a second access transistor that selectively couples a second bitline to the first node.

BRIEF DESCRIPTION OF THE DRAWINGS

The above and other aspects and potential advantages of the present disclosure will be apparent upon consideration of the following detailed description, taken in conjunction with the accompanying drawings, in which like reference characters refer to like parts throughout, and in which.

DETAILED DESCRIPTION

Figure 1:
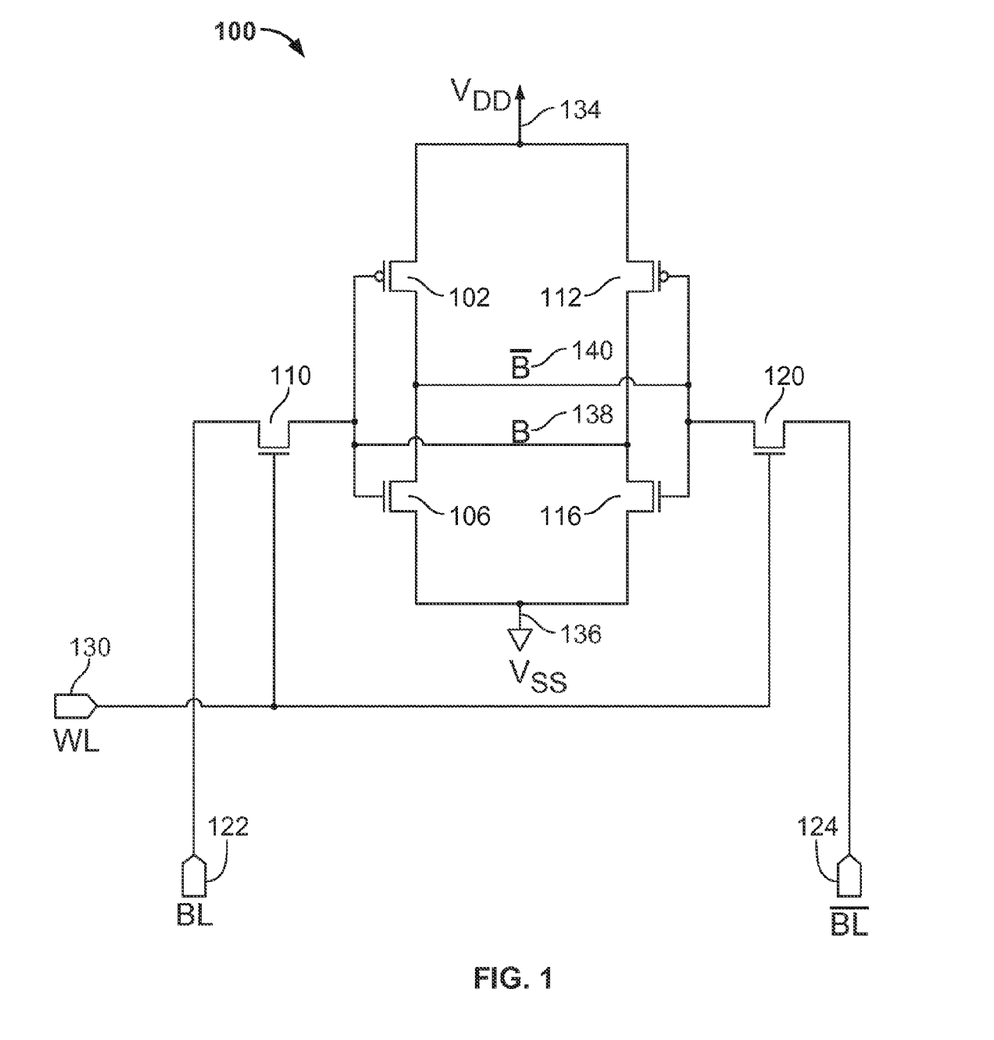
FIG. 1 shows a schematic of a static random-access memory (SRAM) cell, in accordance with some embodiments of the present disclosure.

FIG. 1 shows a schematic of a static random-access memory (SRAM) cell 100, in accordance with some embodiments of the present disclosure. SRAM cell 100 may consist of a number of transistors, such as transistors 102, 106, 112, and 116, which may be configured to operate as two separate inverters. Transistors 102 and 106, and transistors 112 and 116 may be of opposite polarity in order to provide the desired inversion operation. For example, transistors 102 and 112 may be p-channel transistors, and transistors 106 and 116 may be n-channel transistors although the assignment of p-channel and n-channel transistors may be flipped without departing from the scope of the present disclosure. For brevity, p-channel transistors 102 and 112 will be referred to as PMOS 102 and PMOS 112, respectively. N-channel transistors 106 and 116 will be referred to as NMOS 106 and NMOS 116, respectively.

In some embodiments, PMOS 102 and NMOS 106 may correspond to a first inverter of SRAM cell 100, and PMOS 112 and NMOS 116 may correspond to a second inverter of SRAM cell 100. The inverters may be coupled to one another by connecting the gate terminals of PMOS 102 and NMOS 106 with the drain terminals of PMOS 112 and NMOS 116, thereby forming connecting node 138. Conversely, the gate terminals of PMOS 112 and NMOS 116 may be connected to the drain terminals of PMOS 102 and NMOS 106, thereby forming connecting node 140. By connecting the first inverter and the second inverter in this way, a feedback loop is created between the first and the second inverter. This feedback loop may only be stable in two distinct states. The first of these two states may correspond to connecting node 138 being associated with high reference potential 134 and connecting node 140 being associated with low reference potential 136. The second of these two states may correspond to connecting node 138 being associated with low reference potential 136 and connecting node 140 being associated with high reference potential 134. Because the feedback loop between the first inverter and the second inverter is stable in only two states, the feedback loop may also be referred to as being "bi-stable."

In some aspects, the first and second stable states of SRAM cell 100 may be used to store one bit of information. The first information state of SRAM cell 100 may correspond to the case in which connecting node 138 is associated with a voltage that is substantially equal to high reference potential 134 (also denoted as HIGH for brevity). When connecting node 138 is HIGH, so are the gate terminals of PMOS 102 and NMOS 106, thus turning PMOS 102 off and turning NMOS 106 on. As a result of NMOS 106 turning on, connecting node 140 is driven to low reference potential 136 (also denoted as LOW for brevity). As connecting node 140 is driven LOW, so are the gate terminals of PMOS 112 and NMOS 116. Accordingly, PMOS 112 turns on because its gate terminal is LOW, and NMOS 116 turns off because its gate terminal is LOW. As a result, connecting node 138 is driven to high reference potential 134. Connecting node 138 may be connected to the gate terminals of PMOS 102 and NMOS 106, thus reinforcing high reference potential 134 at the gate terminals of PMOS 102 and NMOS 106 and completing the bi-stable feedback loop.

A second information state of SRAM cell 100 may correspond to the case in which connecting node 138 is associated with a voltage that is substantially equal to low reference potential 136. Accordingly, because connecting node 138 is LOW, so are the gate terminals of PMOS 102 and NMOS 106, thus turning PMOS 102 on and turning NMOS 106 off. As a result of PMOS 102 turning on, connecting node 140 is driven to high reference potential 140. As connecting node 140 is driven HIGH, so are the gate terminals of PMOS 112 and NMOS 116. Accordingly, PMOS 112 turns off because its gate terminal is HIGH, and NMOS 116 turns on because its gate terminal is HIGH. Connecting node 138 is therefore driven to low reference potential 136 because of NMOS 116 turning on. As connecting node 138 is connected with the gate terminals of PMOS 102 and NMOS 106, the feedback loop is completed, and low reference potential 136 at the gate terminals of PMOS 102 and NMOS 106 is reinforced.

In some aspects, SRAM cell 100 may be stable in only the two states mentioned above, i.e., connecting node 138 may be either HIGH or LOW, and SRAM cell 100 may retain one of these two states as long as SRAM cell 100 remains connected to high reference potential 134 and low reference potential 136. This may be an important benefit over other memory architectures, such as dynamic random-access memories, that require periodic refreshing to retain an information state stored in the memory cells.

Access to the information state stored in SRAM cell 100 may be provided through bitline 122, inverted bitline 124, and wordline 130. Bitline 122 may be connected to a source terminal of access transistor 110, whose drain terminal is connected with the gate terminal of PMOS 102, NMOS 106, and connecting node 138. Similarly, inverted bitline 124 may be connected to the drain terminal of access transistor 120, whose source terminal is connected to the gate terminal of PMOS 112, NMOS 116, and connecting node 140. Wordline 130 may be connected to the gate terminal of access transistor 110 and access transistor 120 in order to selectively couple bitline 122 to connecting node 138, and inverted bitline 124 to connecting node 140, respectively. In some aspects, bitline 122 and inverted bitline 124 may carry information that has been read from, or that is to be written to SRAM cell 100. Wordline 130 may trigger read and write operations to and from SRAM cell 100.

In some embodiments, the information state of SRAM cell 100 may need to be modified in connection with performing a write procedure. In what follows, it will be assumed that a LOW state at connecting node 138 corresponds an information state of logical zero, and that a HIGH state at connecting node 138 corresponds to an information state of logical one. It is noted, however, that the assignment of logical zero and logical one could be interchanged without departing from the scope of the present disclosure. Because of the operation of the bi-stable feedback loop, the information state of logical zero may correspond to a HIGH state at connecting node 140, and the information state of logical one may correspond to a LOW state at connecting node 140.

Assuming that SRAM cell 100 stores an information state of logical zero, connecting node 138 is LOW and connecting node 140 is HIGH. In order to change the information state of SRAM cell 100 to logical one (i.e., to write logical one to SRAM cell 100), bitline 122 may be set to HIGH and inverted bitline 124 may be set to LOW. Next, wordline 130 may be triggered which turns on access transistors 110 and 120. Once access transistor 110 has turned on, bitline 122, which is at high reference potential 134, attempts to drive connecting node 138 from LOW to HIGH. At the same time, NMOS 116 seeks to keep connecting node 138 at low reference potential 136, because NMOS 116 is turned on and therefore connects connecting node 138 to low reference potential 136. In some aspects, in order to achieve a well-defined outcome of this interaction between access transistor 110 and NMOS 116, SRAM cell 100 may be designed such that access transistor 110 is "stronger" than NMOS 116, such that access transistor 110 is able to pull connecting node 138 to high reference potential 134. Via the bi-stable feedback loop of SRAM cell 100, the high reference potential at connecting node 138 feeds back to the gate terminal of NMOS 116 and turns NMOS 116 off. The interaction between access transistor 110 and NMOS 116 is sometimes referred to as "fighting" between these transistors.

In some implementations, even though access transistor 110 is designed to be stronger than NMOS 116, process variations may result in access transistor 110 being weaker than NMOS 106, at least for some SRAM cells. In such a case, it may no longer be possible to change the state of SRAM cell 100, i.e., write operations to SRAM cell 100 may be unsuccessful. Accordingly, an SRAM cell 100 for which access transistor 100 is weaker than NMOS 116, may need to be discarded, thereby reducing the yield associated with a fabrication process of SRAM cell 100.

In accordance with some embodiments, the information state of SRAM cell 100 may be retrieved by using bitline 122, inverted bitline 124, and wordline 130. For example, bitline 122 and inverted bitline 124 may both be pre-charged to high reference potential 134 and then "floated," such as by associating bitline 122 and inverted bitline 124 with a high impedance state. Accordingly, a voltage associated with bitline 122 and inverted bitline 124 may not be actively driven, but may rather result from the information state stored by SRAM cell 100. A read operation of SRAM cell 100 may be triggered by enabling wordline 130 and thus turning on access transistors 110 and 120. Once access transistors 110 and 120 are enabled, bitline 122 may be connected to connecting node 138 and inverted bitline 124 may be connected to connecting node 140.

Assuming that the information state stored in SRAM cell 100 is logical zero, connecting node 138 may be LOW and connecting node 140 may be HIGH. Once access transistors 110 and 120 are enabled, bitline 122 may be pulled towards low reference potential 136 by NMOS 116 which is active and thus connects connecting node 138 with bitline 122. Conversely, inverted bitline 124 may remain at high reference potential 134, because connecting node 140, with which inverted bitline 124 is connected through access transistor 120, is already associated with high reference potential 134. As a result of coupling bitline 122 and inverted bitline 124 to connecting nodes 138 and 140, a voltage differential may occur between bitline 122 and inverted bitline 124, which may be sensed to determine the information state of SRAM cell 100 prior to the read operation. In some implementations, it may not be necessary to wait until bitline 122 reaches a LOW state. Rather, a voltage differential between bitline 122 and inverted bitline 124 may be amplified, such as by a sense amplifier, and once the voltage differential exceeds a threshold value, the state of SRAM cell 100 may be determined.

Figure 2:
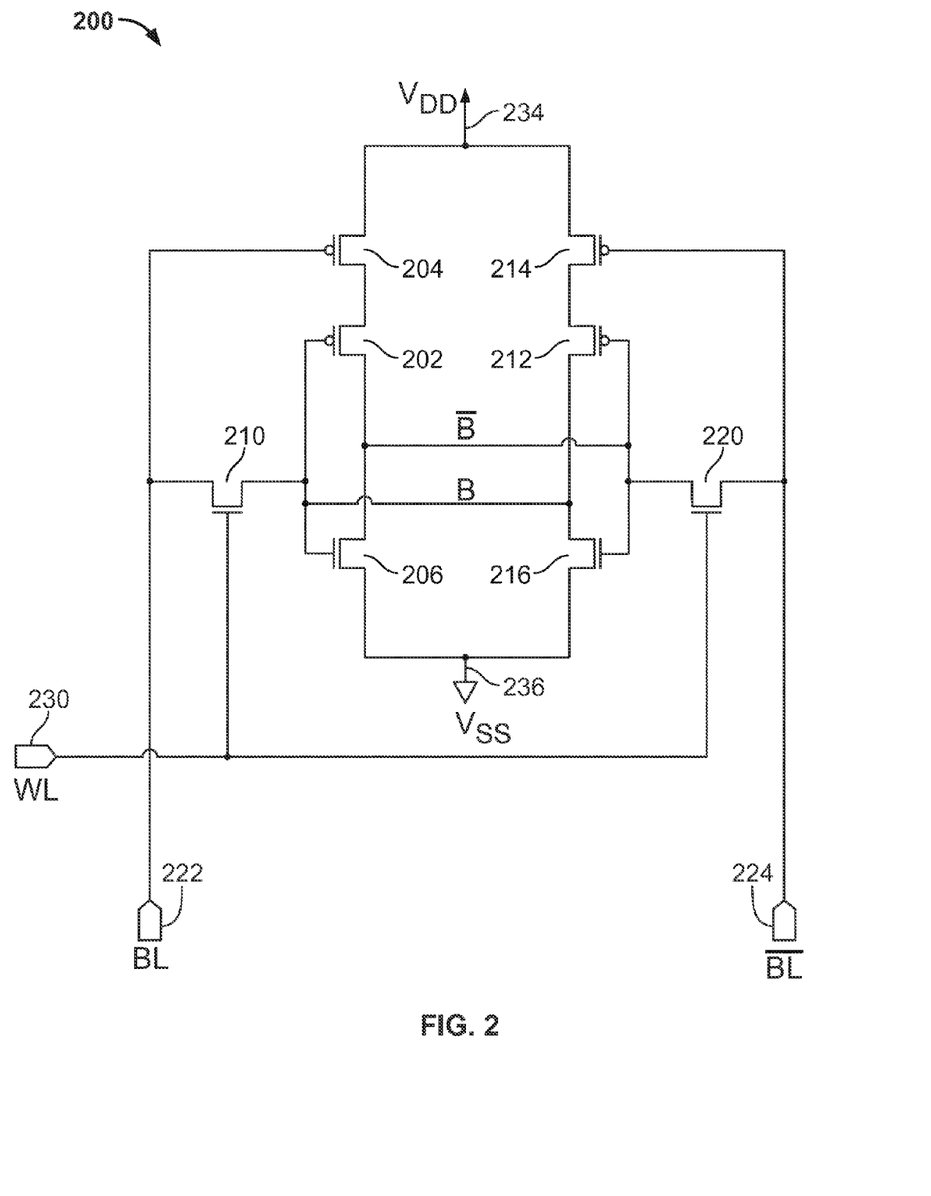
FIG. 2 shows a schematic of an SRAM cell that avoids fighting based on a pair of isolation transistors, in accordance with some embodiments of the present disclosure.

FIG. 2 shows a schematic of an SRAM cell 200 that avoids fighting based on a pair of isolation transistors, in accordance with some embodiments of the present disclosure. Similar to SRAM cell 100 discussed in relation to FIG. 1, SRAM cell 200 may include a first inverter, consisting of PMOS 202 and NMOS 206, and a second inverter, consisting of PMOS 212 and NMOS 216. The first inverter and the second inverter may be coupled by connecting node 238 and connecting node 240 to form a bi-stable feedback loop that stores one information bit. Similar to SRAM cell 100, SRAM cell 200 may also include access transistors 210 and 220, coupled with bitline 222 and inverted bitline 224, respectively. Wordline 230 may be connected to the gate terminals of access transistors 210 and 220 and may trigger read operations from, and write operations to SRAM cell 200.

In some aspects, as is discussed in relation to FIG. 1, fighting may occur between access transistor 210 and PMOS 212. Fighting may also occur between access transistor 220 and PMOS 202. In order to prevent such fighting, SRAM cell 200 may include an isolation transistor 204 and an isolation transistor 214, both of which may be p-channel transistors. Isolation transistor 204 and isolation transistor 214 may be connected in series with PMOS 202 and PMOS 212, respectively. When turned off, isolation transistor 204 may isolate PMOS 202 from high reference potential 234, and isolation transistor 214 may isolate PMOS 212 from high reference potential 234. The gate terminals of isolation transistor 204 and isolation transistor 214 may be connected to bitline 222 and inverted bitline 224, respectively.

In some aspects, isolation transistor 204 and isolation transistor 214 may avoid or reduce fighting during write operations to SRAM cell 200. For instance, similar to the example discussed in relation to FIG. 1, it may be assumed that a logical one is to be written to SRAM cell 200, which stores an information state of zero prior to the beginning of the write operation. In order to perform the write operation, bitline 222 may be driven HIGH and inverted bitline 224 may be driven LOW. Once bitline 222 becomes HIGH, isolation transistor 204 turns off. At the same time, isolation transistor 214 remains enabled, because inverted bitline 224 continues to be LOW. Next, wordline 230 may be triggered which enables access transistors 210 and 220. Without isolation transistor 204, fighting would occur between inverted bitline 224, which is LOW, and PMOS 202 which connects connecting node 240 with high reference potential 234. However, because isolation transistor 204 is present and turned off during the writing of a logical one, no fighting occurs between second access transistor 220 and PMOS 202, because PMOS 202 is isolated from high reference potential 234 by isolation transistor 204. Consequently, even in implementations where access transistor 220 is weaker than PMOS 202, access transistor 220 may be able to pull connecting node 240 to LOW, thus successfully changing the state of SRAM cell 200.

Alternatively, if the information state of SRAM cell 200 is to be modified from logical one to logical zero, isolation transistor 214 may provide the necessary isolation from high reference potential 234. In particular, in order to write a logical zero to SRAM cell 200, bitline 222 may be set to LOW and inverted bitline 224 may be set to HIGH. Setting inverted bitline 224 to HIGH turns off isolation transistor 214. Isolation transistor 204 may remain turned on, because bitline 222 is driven to LOW. To commence the writing operation, wordline 230 may be triggered, which enables access transistors 210 and 220. Without isolation transistor 214, fighting may occur between access transistor 210 and PMOS 212, which is turned on because connecting node 238 is HIGH, in accordance with the initial information state of logical zero of SRAM cell 200. Accordingly, access transistor 210 would seek to pull connecting node 238 LOW while PMOS 212 would seek to pull connecting node 238 HIGH. However, due to isolation transistor 214 being off, connecting node 238 is no longer being pulled HIGH by PMOS 212 because connecting node 238 is isolated from high reference potential 234.

Figure 3:
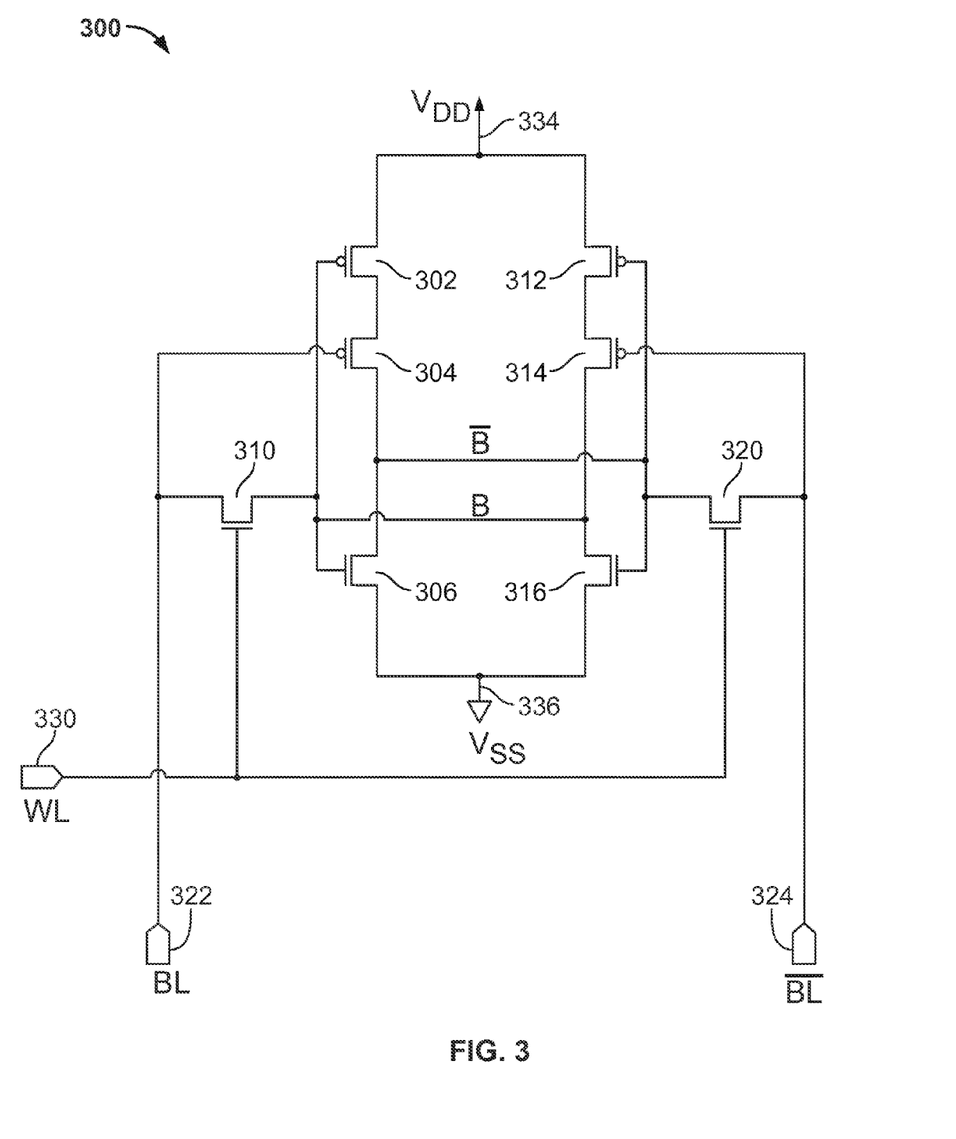
FIG. 3 shows a schematic of an alternative configuration for avoiding fighting in an SRAM cell based on a pair of isolation transistors, in accordance with some embodiments of the present disclosure.

FIG. 3 shows a schematic of an alternative configuration for avoiding fighting in an SRAM cell 300 based on a pair of isolation transistors, in accordance with some embodiments of the present disclosure. Similar to SRAM cell 200 discussed in relation to FIG. 2, SRAM cell 300 may include a first inverter, consisting of PMOS 302 and NMOS 306, and a second inverter, consisting of PMOS 312 and NMOS 316. The first inverter and the second inverter may be coupled by connecting node 338 and connecting node 340 to form a bi-stable feedback loop that stores one information bit. Similar to SRAM cell 200, SRAM cell 300 may also include access transistors 310 and 320, coupled to bitline 322 and inverted bitline 324, respectively. Wordline 330 may be connected to the gate terminals of access transistors 310 and 320, and may trigger read operations from, and write operation to SRAM cell 300.

Different from SRAM cell 200, a source terminal of isolation transistor 304 may be connected to a drain terminal of PMOS 302, and a drain terminal of isolation transistor 304 may be connected to connecting node 340. Similarly, a source terminal of isolation transistor 314 may be connected to a drain terminal of PMOS 312, and a drain terminal of isolation transistor 314 may be connected to connecting node 338.

Therefore, the positions of isolation transistor 304 and PMOS 302 and the positions of isolation transistor 314 and PMOS 312 are essentially exchanged in SRAM cell 300 with respect to SRAM cell 200. Despite exchanging isolation transistors 304 and 314 with PMOS 302 and 312, the operation of SRAM cell 300 is substantially similar to the one of SRAM cell 200, because isolation transistors 304 and 314 remain connected in series with PMOS 302 and 312. Therefore, when either of isolation transistors 304 and 314 is enabled, connecting nodes 338 and 340 are isolated from first reference potential 334. Therefore read and write operations using SRAM cell 300 may be performed in a substantially similar manner as in SRAM cell 200.

Figure 4:
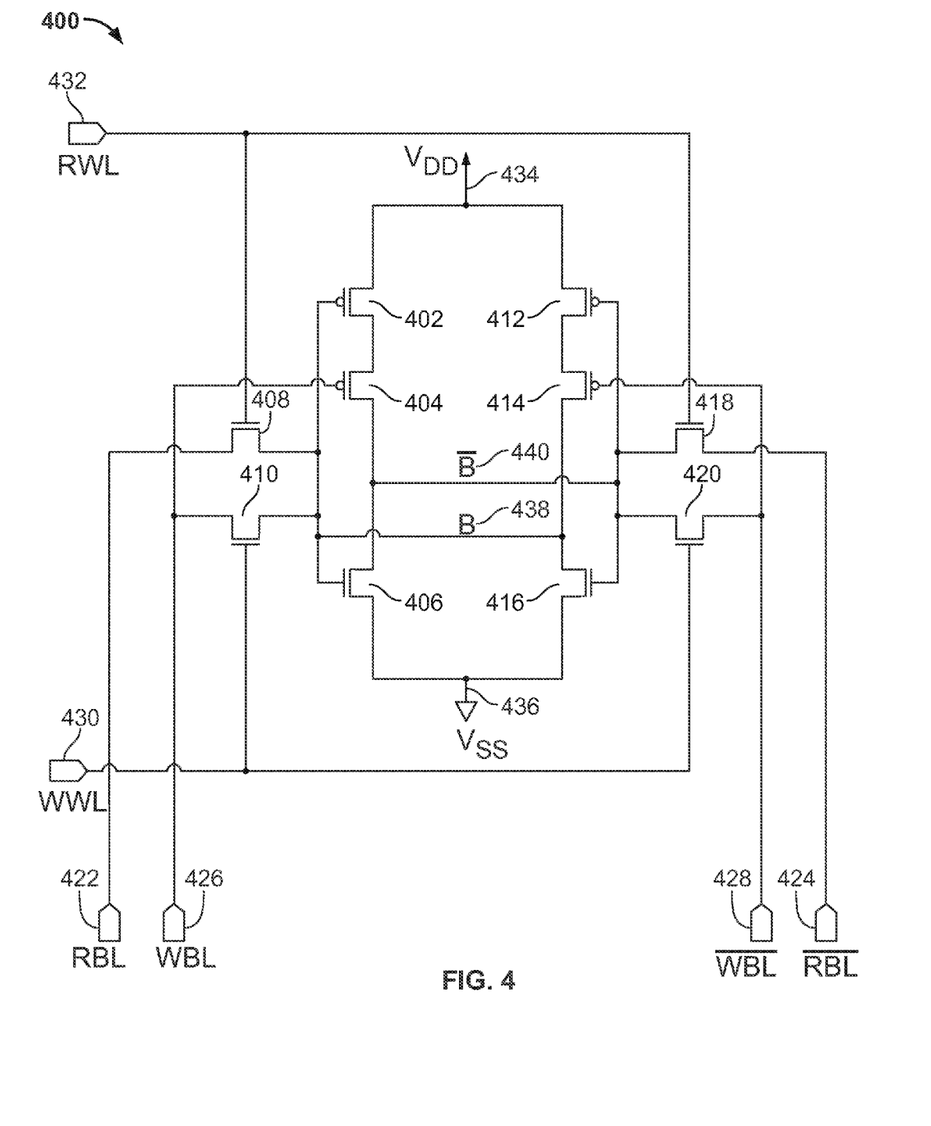
FIG. 4 shows a schematic of an SRAM cell that avoids fighting and reduces read disturbance, in accordance with some embodiments of the present disclosure.

FIG. 4 shows a schematic of an SRAM cell 400 that avoids fighting and reduces read disturbance, in accordance with some embodiments of the present disclosure. Similar to SRAM cell 300 discussed in relation to FIG. 3, SRAM cell 400 may include a first inverter, consisting of PMOS 402 and NMOS 406, and a second inverter, consisting of PMOS 412 and NMOS 416. The first inverter and the second inverter may be coupled by connecting node 438 and connecting node 440 to form a bi-stable feedback loop that stores one information bit.

SRAM cell 400 may further include two pairs of access transistors, one pair that is used for writing to SRAM cell 400, and one that is used for reading from SRAM cell 400. The pair of access transistors used for write operations may correspond to write access transistors 410 and 420. Write access transistors 410 and 420 may be connected to a write bitline 426 and an inverted write bitline 428. Gate terminals of write access transistors 410 and 420 may be connected to a write wordline 430 that is triggered when a write operation is to be performed.

SRAM cell 400 may further include a pair of read access transistors, such as read access transistors 408 and 418. Read access transistors 408 and 418 may be connected to a read bitline 422 and an inverted read bitline 424, respectively. Gate terminals of read access transistors 408 and 418 may be connected with read wordline 432 that is triggered when a read operation is to be performed.

A write operation to SRAM cell 400 may be performed in a similar manner as is discussed in relation to FIG. 2. In order to modify the state of SRAM cell 400, either write bitline 426 is driven HIGH and inverted write bitline 428 is driven LOW (i.e., when a logical one is to be written to SRAM cell 400) or write bitline 426 is driven LOW and inverted write bitline 428 is driven HIGH (i.e., when a logical zero is to be written to SRAM cell 400). Once write bitline 426 and inverted write bitline 428 assume their respective reference potentials (i.e., either LOW or HIGH), write wordline 430 is triggered, which turns on write access transistors 410 and 420. At the same time, because either write bitline 426 or inverted write bitline 428 is associated with high reference potential 434, either isolation transistor 404 or isolation transistor 414 will turn off. Once turned off, the respective isolation transistor isolates either connecting node 438 or connecting node 440 from high reference potential 434. Accordingly, as is discussed in relation to FIG. 2, fighting between access transistors 410 and 420 and PMOS 402 and 412 is avoided.

In some embodiments, SRAM cell 400 may avoid, or at least reduce, the occurrence of read disturbance while reading from SRAM cell 400. Read disturbance may refer to a scenario in which the information state stored by SRAM cell 400 is compromised during reading, e.g., by flipping the information state stored by SRAM cell 400 from logical one to logical zero or vice versa. In some implementations, read disturbance may be exacerbated in SRAM cell 200 compared to SRAM cell 100 because, when access transistors 210 and 220 are enabled, so are isolation transistors 204 and 214. Accordingly, while the state of the SRAM cell 200 is being read, SRAM cell 200 is isolated from high reference potential 434. If a read operation takes sufficiently long, leakage of NMOS transistors 406 and 416 may be large enough to cause the information state of SRAM cell 200 to flip, thus compromising the information state that was stored in SRAM cell 200.

In some aspects, SRAM cell 400 avoids or reduces the occurrence of read disturbance by using a pair of read access transistors (e.g., read access transistors 408 and 418) that are distinct from write access transistors 410 and 420. SRAM cell 400 may further include separate read bitlines (e.g., read bitline 422 and inverted read bitline 424), and a separate read wordline (e.g., read wordline 432). As a result of using separate access transistors, bitlines, and wordlines for reading, read bitline 422 and inverted read bitline 424 may be pre-charged to high reference potential 434 without affecting isolation transistors 404 and 414, i.e., without turning off either isolation transistor 404 and 414. Instead, while reading is performed, write bitline 426 and inverted write bitline 428 may be driven to low reference potential 436 which keeps isolation transistors 404 and 414 turned on. As a result, while reading is performed, the first inverter and the second inverter of SRAM cell 400 remains connected to high reference potential 434 without interrupting the bi-stable feedback loop. Therefore, leakage that occurs due to transistor imperfections, may be compensated for through the feedback loop between the first inverter and the second inverter.

Figure 5:
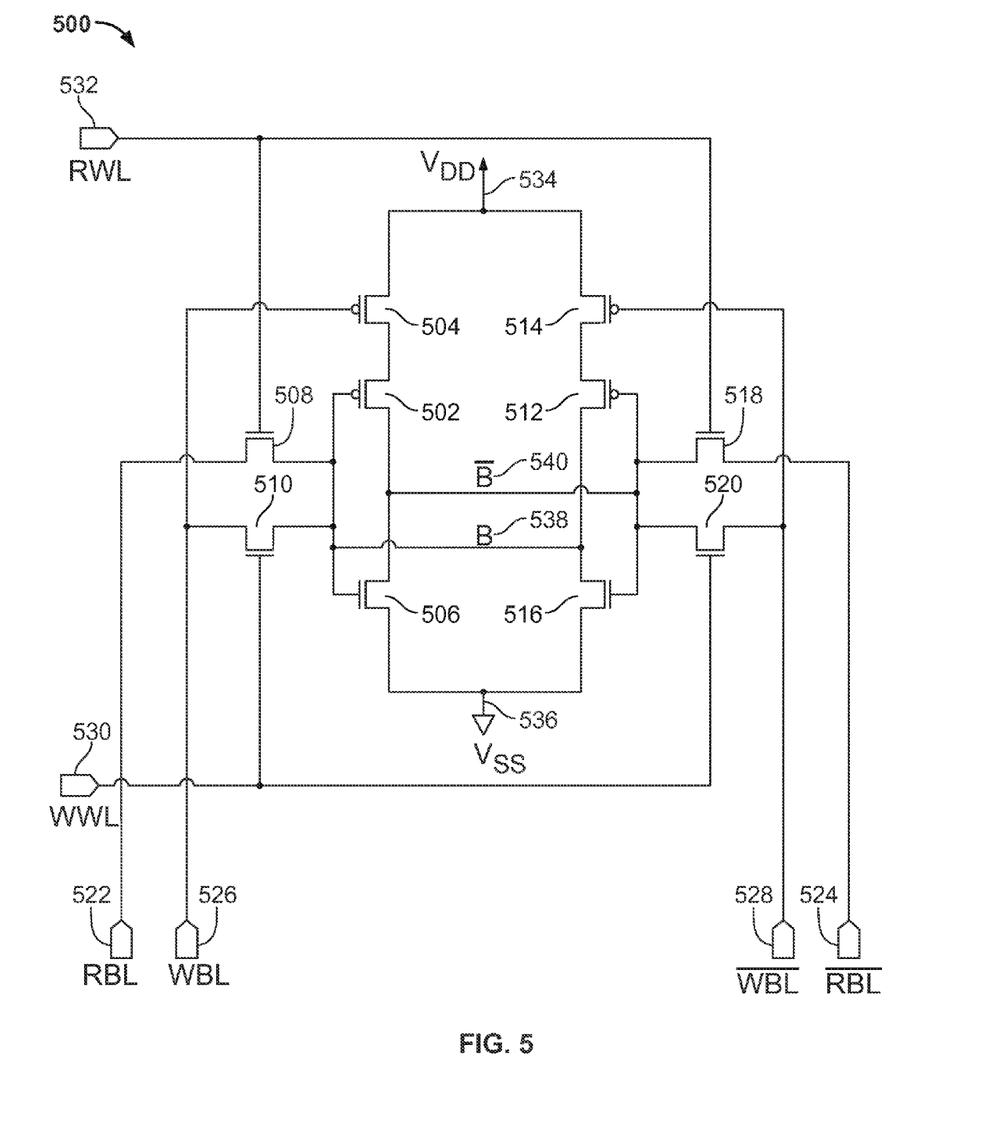
FIG. 5 shows a schematic of an alternative configuration for avoiding fighting and reducing read disturbance in an SRAM cell, in accordance with some embodiments of the present disclosure.

FIG. 5 shows a schematic of an alternative configuration for avoiding fighting and reducing read disturbance in an SRAM cell 500, in accordance with some embodiments of the present disclosure. Similar to SRAM cell 400 discussed in relation to FIG. 4, SRAM cell 500 may include a first inverter, consisting of PMOS 502 and NMOS 506, and a second inverter, consisting of PMOS 512 and NMOS 516. The first inverter and the second inverter may be coupled by connecting nodes 538 and 540 to form a bit-stable feedback loop that stores one information bit. Similar to SRAM cell 400, SRAM cell 500 may also include read access transistors 508 and 512 coupled to read bitline 522 and inverted read bitline 528, respectively. Read wordline 532 may be connected to the gate terminals of read access transistors 508 and 518, and may trigger a read operation from SRAM cell 500. SRAM cell 500 may further include write access transistors 510 and 520, coupled to write bitline 522 and inverted write bitline 528, respectively. Write wordline 530 may be connected to the gate terminals of write access transistors 510 and 520, and may trigger a write operation to SRAM cell 500.

Different from SRAM cell 400, a source terminal of isolation transistor 504 may be connected to high reference potential 534 and a drain terminal of isolation transistor 504 may be connected to a source terminal of PMOS 502. Similarly, a source terminal of isolation transistor 514 may be connected to high reference potential 534 and a drain terminal of isolation transistor 514 may be connected to a source terminal of PMOS 512. Therefore, the positions of isolation transistor 504 and PMOS 502 and the positions of isolation transistor 514 and PMOS 512 are essentially interchanged in SRAM cell 500 with respect to SRAM cell 400. Despite exchanging isolation transistors 504 and 514 with PMOS 502 and 512, the operation of SRAM cell 500 is substantially similar to the one of SRAM cell 400, because isolation transistors 504 and 514 remain connected in series with PMOS 502 and 512. Therefore, when either of isolation transistors 504 and 512 is enabled, connecting nodes 538 and 540 are isolated from high reference potential 534. Therefore, read and write operations using SRAM cell 500 may be performed in a substantially similar manner as in SRAM cell 400.

Figure 6:
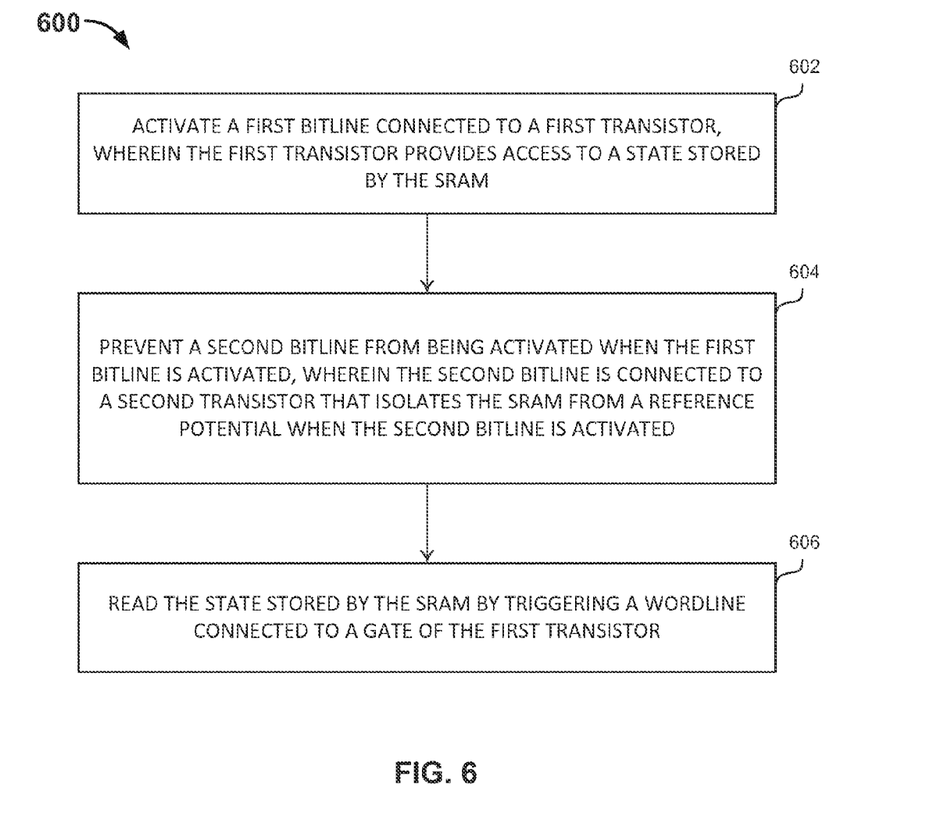
FIG. 6 is a high-level flow chart of a method for reading from an SRAM, in accordance with some embodiments of the present disclosure.

FIG. 6 is a high-level flow chart of a process 600 for reading from an SRAM, in accordance with some embodiments of the present disclosure. SRAM cell 400 may perform process 600 by, at 602, activating a first bitline connected to a first transistor, wherein the first transistor provides access to a state stored by the SRAM. Process 600 may, at 604, prevent a second bitline from being activated when the first bitline is activated, wherein the second bitline is connected to a second transistor that isolates the SRAM from a reference potential when the second bitline is activated. At 606, process 600 may read the state stored by the SRAM by triggering a wordline connected to a gate of the first transistor.

At 602, a first bitline connected to a first transistor is activated, wherein the first transistor provides access to a state stored by the SRAM. In some implementations, the first bitline may correspond to read bitline 422, which is connected to a source terminal of read access transistor 408 and provides access to the information state stored by SRAM cell 400. In some implementations, as is discussed in relation to FIG. 4, activating read bitline 422 may include pre-charging bitline 422 to high reference potential 434 and then floating bitline 422, for example by putting it in a high impedance state or by using other suitable means. In some embodiments, process 600 may also activate an inverted bitline at 602, such as inverted read bitline 428 of FIG. 4. In accordance with the read procedure discussed in relation to FIG. 4, inverted read bitline 428 may also be pre-charged to high reference potential 434 in preparation of triggering the read procedure.

At 604, process 600 may prevent a second bitline from being activated when the first bitline is activated, wherein the second bitline is connected to a second transistor that isolates the SRAM from a reference potential when the second bitline is activated. In some implementations, the second bitline may correspond to write bitline 426 and the second transistor may correspond to isolation transistor 404. Process 600 may prevent bitline 426 from being activated by keeping write bitline 426 at low reference potential 436. By doing so, isolation transistor 404 remains turned on, and therefore the first and the second inverter of SRAM cell 400 remain connected to high reference potential 434. In some implementations, process 600 may further prevent inverted write bitline 428 from being activated by keeping inverted bitline 428 at low reference potential 436. By doing so, isolation transistor 414 remains turned on and therefore the second inverter of SRAM cell 400, consisting of PMOS 412 and NMOS 416, remains connected to low reference potential 436.

By preventing write bitline 426 and inverted write bitline 428 from becoming active while read bitline 422 and inverted read bitline 424 are being pre-charged for a read operation, SRAM cell 400 may reduce the likelihood that leakage associated with NMOS 406 or NMOS 416 will be sufficient to cause a change of the information state stored by SRAM cell 400. In particular, because the first inverter and the second inverter of SRAM cell 400 remain connected to high reference potential 434 and low reference potential 436, the bi-stable feedback loop of SRAM cell 400 is not interrupted, making it less likely that spurious effects cause the information state of SRAM cell 400 to change.

Process 600 may, at 606, read the state stored by the SRAM by triggering a wordline connected to a gate of the first transistor. In some embodiments, the wordline may correspond to read wordline 432 and the first transistor may correspond to read access transistor 408. As is discussed in relation to FIG. 4, read wordline 400 may be triggered once read bitline 422 and inverted read bitline 424 have been pre-charged to high reference potential 434, and write bitline 426 and inverted write bitline 424 have been driven to low reference potential 436, assuming they were not already associated with low reference potential 436. Triggering read wordline 432 causes read access transistors 408 and 418 to turn on, thereby causing read bitline 422 and inverted read bitline 424 to be connected to connecting nodes 438 and 440, respectively. As is discussed in relation to FIG. 4, depending on the information state stored in SRAM cell 400, one of connecting nodes 438 and 440 will be associated with high reference potential 434 and the other will be associated with low reference potential 436. Once read bitline 422 and inverted read bitline 424 are connected to connecting nodes 438 and 440 through read access transistors 408 and 418, both of which are pre-charged to high reference potential 434, one of read bitline 422 and inverted read bitline 424 will be pulled to low reference potential 436. A voltage difference between read bitline 422 and inverted read bitline 424 results, which may be amplified by a sense amplifier as necessary and detected by detection circuitry. Based on the sensed voltage difference, the detector may determine the information state of SRAM cell 400 and conclude the read operation.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow.

What is claimed is:

1. A method for reading from a static random-access memory (SRAM), the method comprising:
    activating a first bitline connected to a first transistor, wherein the first transistor provides access to a state stored by the SRAM;
    preventing a second bitline from being activated when the first bitline is activated, wherein the second bitline is connected to a second transistor that isolates the SRAM from a reference potential when the second bitline is activated; and
    reading the state stored by the SRAM by triggering a wordline connected to a gate of the first transistor.

2. The method of claim 1, wherein the first bitline is a read bitline and the second bitline is a write bitline.

3. The method of claim 1, wherein the wordline is a first wordline, the method further comprising:
    preventing a second wordline from being triggered when the first wordline is triggered, wherein the second wordline is connected to a gate of a third transistor that is activated when writing to the SRAM.

4. The method of claim 1, wherein the wordline is a first wordline, and the method further comprises modifying the state stored by the SRAM by:
    activating the second bitline connected to the second transistor to isolate the SRAM from a reference potential;
    preventing the first bitline from being activated when the second bitline is activated; and
    modifying the state stored by the SRAM by triggering a second wordline connected to a gate of a second transistor.

5. The method of claim 4, wherein activating the second bitline identifies the modified state to be stored by the SRAM.

6. The method of claim 1, wherein activating the first bitline comprises activating a third bitline connected to a third transistor, wherein the third transistor provides access to an inverse of the state stored by the SRAM.

7. The method of claim 1, wherein activating the first bitline comprises pre-charging the first bitline.

8. The method of claim 1, wherein preventing a second bitline from being activated when the first bitline is activated comprises preventing a third bitline from being activated, wherein the third bitline is connected to a third transistor that isolates the SRAM from a reference potential when the third bitline is activated.

9. A system comprising:
    a static random-access memory (SRAM) connected to a first transistor and a second transistor; and
    control circuitry configured to:
        activate a first bitline connected to the first transistor, wherein the first transistor provides access to a state stored by the SRAM;
        prevent a second bitline from being activated when the first bitline is activated, wherein the second bitline is connected to the second transistor that isolates the SRAM from a reference potential when the second bitline is activated; and
        read the state stored by the SRAM by triggering a wordline connected to a gate of the first transistor.

10. The system of claim 9, wherein the first bitline is a read bitline and the second bitline is a write bitline.

11. The system of claim 9, wherein the wordline is a first wordline, and the control circuitry is further configured to prevent a second wordline from being triggered when the first wordline is triggered, wherein the second wordline is connected to a gate of a third transistor that is activated when writing to the SRAM.

12. The system of claim 9, wherein the wordline is a first wordline, and the control circuitry is further configured to modify the state stored by the SRAM by:
    activating the second bitline connected to the second transistor to isolate the SRAM from a reference potential;
    preventing the first bitline from being activated when the second bitline is activated; and
    modifying the state stored by the SRAM by triggering a second wordline connected to a gate of a second transistor.

13. The system of claim 12, wherein activating the second bitline identifies the modified state to be stored by the SRAM.

14. The system of claim 9, wherein the control circuitry is further configured to activate the first bitline by activating a third bitline connected to a third transistor, wherein the third transistor provides access to an inverse of the state stored by the SRAM.

15. The system of claim 9, wherein the control circuitry is further configured to activate the first bitline by pre-charging the first bitline.

16. The system of claim 9, wherein the control circuitry is further configured to prevent the second bitline from being activated by:

preventing a third bitline from being activated, wherein the third bitline is connected to a third transistor that isolates the SRAM from a reference potential when the third bitline is activated.

17. A static random access memory (SRAM) comprising:
a first transistor and a second transistor;
an isolation transistor, wherein:
   the isolation transistor, the first transistor, and the second transistor are connected in series between a first reference potential and a second reference potential, and
   a gate of the first transistor and a gate of the second transistor are connected to a first node;
a first access transistor that selectively couples a first bitline to the first node, wherein the first bitline is connected to a gate of the isolation transistor; and
a second access transistor that selectively couples a second bitline to the first node.

18. The SRAM of claim 17, wherein the first transistor is connected to the first reference potential and the second transistor is connected to the second reference potential.

19. The SRAM of claim 17, wherein the isolation transistor is connected to the first reference potential and the second transistor is connected to the second reference potential.

20. The SRAM of claim 17, wherein the first access transistor is connected to a first wordline that is triggering when performing a write operation and the second access transistor is connected to a second wordline that is triggered when performing a read operation.

\* \* \* \* \*